(12) United States Patent
Kimura

(10) Patent No.: US 6,259,083 B1
(45) Date of Patent: Jul. 10, 2001

(54) SOLID STATE IMAGING DEVICE AND MANUFACTURING METHOD THEREOF

(75) Inventor: Masao Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/133,208

(22) Filed: Aug. 13, 1998

(30) Foreign Application Priority Data

Aug. 13, 1997 (JP) .................................................... 9-218683

(51) Int. Cl.$^7$ .................................................... H01L 27/00
(52) U.S. Cl. ........................ 250/208.1; 250/216; 257/432; 216/24
(58) Field of Search ................................ 250/208.1, 208.2, 250/216; 349/95; 430/321, 330; 257/432, 292, 294, 435; 216/24, 26; 438/65, 69, 75, 78

(56) References Cited

U.S. PATENT DOCUMENTS

| 4,694,185 | * | 9/1987 | Weiss | 250/208.1 |
| 5,306,926 | * | 4/1994 | Yonemoto | 257/432 |
| 5,323,052 | * | 6/1994 | Koyama | 257/432 |
| 5,371,397 | * | 12/1994 | Maegawa et al. | 257/432 |
| 5,593,913 | * | 1/1997 | Aoki | 437/53 |
| 5,633,527 | * | 5/1997 | Lear | 257/432 |
| 5,844,290 | * | 12/1998 | Furumiya | 257/432 |

* cited by examiner

Primary Examiner—Que T. Le
Assistant Examiner—Thanh X. Luu
(74) Attorney, Agent, or Firm—Sonnenschein Nath & Rosenthal

(57) ABSTRACT

A solid state imaging device with a high sensitivity is obtained by introducing an incident light to be incident on a light receiving portion widely. In the solid state imaging device, a layer (8) having a concave lens structure is provided in a portion from a sensor opening to an upper most surface layer and a well-shaped dug structure (21) is provided at a bottom portion of the concave lens structure.

15 Claims, 4 Drawing Sheets

SOLID STATE IMAGING DEVICE AND MANUFACTURING METHOD THEREOF

BACKGROUND OF THE INVENTION

1. Field of the invention

The present invention relates to a solid state imaging device having, for example, a concave lens structure formed therein and its manufacturing method.

2. Description if the Related Art

Recently, in a color solid state imaging device, as the device is down-sized, a so-called on-chip structure, in which a color filter is formed within the device and further a microlens is formed on the color filter, is employed, whereby an incident light is converted by the microlens to improve the sensitivity at a sensor or light receiving portion.

Further, there is proposed such a solid state imaging device in which a second lens structure having a light converging characteristic is provided in the solid state imaging device having the above-mentioned on-chip structure between the microlens on its surface and the light receiving portion.

As the second lens structure, there is proposed a concave lens structure in which the boundary face between two layers having different refractive indexes, for example, is a concave face on which a concave lens is formed, and so on.

FIG. 1 is a schematic diagram showing an example of a solid state imaging device 50 in which a concave lens structure is formed between a surface layer and a light receiving portion.

In the solid state imaging device 50, a sensor (light receiving portion) 52 is formed in the semiconductor substrate 51 and a transfer electrode 54 is formed on the semiconductor substrate 51 except for the light receiving portion 52 through a gate insulating film 53. A light shielding film 56 is formed on the transfer electrode 54 through an intra-layer insulating film 55. The light shielding film 56 prevents a light from being incident on the transfer electrode 54. An opening is formed through the light shielding film 56 at its portion on the light receiving portion 52 so that the light is incident on the light receiving portion 52 through the opening.

For example, a BPSG film 57 is formed to cover the light shielding film 56. This BPSG film 57 has on its surface a concave and a convex corresponding to a step formed by the light shielding film 56 or the surface portion of the BPSG film 57 just on the light receiving portion 52 becomes a concave portion.

On the BPSG film 57, there is formed a high refractive index layer 58 which is made of, for example, a SiN film (refractive index n=1.9~2.0) or the like to form a concave lens structure (so-called intra-layer lens) therein. The upper surface of the high refractive index layer 58 is flattened and a color filter 60 is formed on the flattened surface through a passivation film 59. On the color filter 60, a microlens is formed 61.

In this case, in order that a light incident on the concave lens surface, namely on the boundary surface between the two layer or BPSG film 57 and the high refractive layer 58 is converged on the light receiving portion 52, it is necessary to adjust the relation between the refractive indexes of the BPSG film 57 and the high refractive index layer 58.

In general, in consideration of the concave lens, in order to converge the incident light on the light on the light receiving portion 52, such an adjustment is carried out that the refractive index of the high refractive index layer 58, which is an upper layer than the BPSG film 57 with the lens surface as the boundary, is made higher than the refractive index of the BPSG film 57.

When a light is incident on the concave lens surface in an inclined direction, however, dependent on the incident angle of light, there is such a case that the light will be incident on the concave lens surface at a large angle which will not occur in a structure having formed no concave lens structure.

Therefore, it will be predicted that a total reflection of light occurs on the concave lens surface dependent on the incident angle and hence there may be such a fear that the improvement of sensitivity becomes insufficient.

SUMMARY OF THE INVENTION

In view of the above-mentioned point, it is an object of the present invention to provide a solid state imaging device with high sensitivity in which an incident light is introduced to a light receiving portion widely. According to an aspect of the present invention, there is provided a solid state imaging device in which provided is a layer having a concave lens structure in a portion from an opening of a sensor to an uppermost surface layer and a well-shaped dug structure is formed at a bottom portion of the concave lens structure.

According to the solid state imaging device with the above arrangement of the present invention, since the well-shaped dug structure is provided at the bottom portion of the concave lens structure, a light incident on the bottom portion of the concave lens structure at a large incident angle does not cause a total reflection, but is introduced to the sensor opening by the well-shaped dug structure, to thereby increase a light receiving amount in the sensor.

DESCRIPTION OF THE PREFERRED EMBODIMENTS

The present invention provides a solid state imaging device having a layer provided with a concave lens structure in a portion from an opening of a sensor to a layer on an upper most surface, in which a well-shaped dug structure is formed at a bottom portion of the concave lens structure.

In the above-mentioned solid state imaging device according to the present invention, the refractive index of the material, which buries the well-shaped dug structure and the concave lens structure and is fattened, is made to be larger than the refractive index of the material used for the concave lens structure.

Further, in the above-mentioned solid state imaging device of the present invention, the width of the well-shaped dug structure in the substrate surface direction is made small than the sensor opening width, and the ratio between the depth and the width of the well-shaped dug structure is made sufficiently large, whereby an incident light occurs a total reflection in the well-shaped dug structure.

As example of the solid state imaging device according to the present invention will be described in detail with reference to the accompanying drawings.

Figure 2:
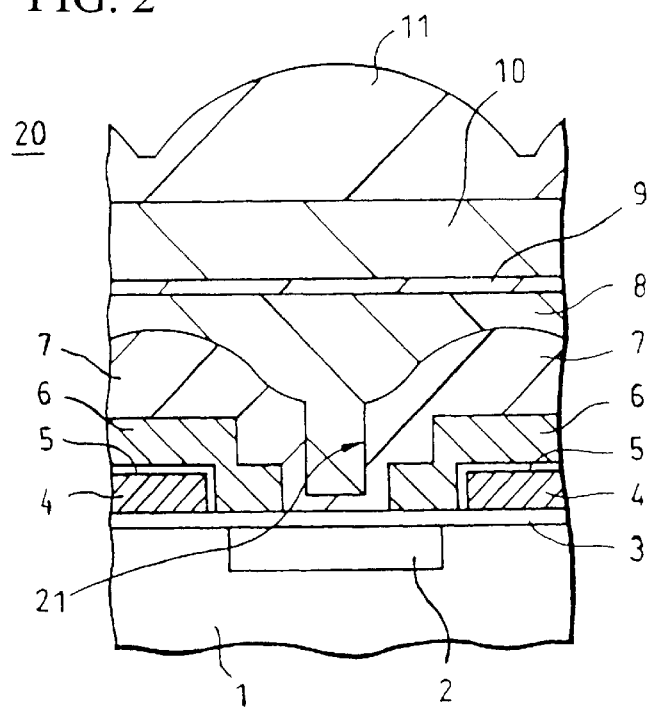
FIG. 2 is a schematic diagram (sectioned view of one pixel) showing an example of the solid state imaging device according to the present invention; having a well-shaped dug structure

FIG. 2 is a sectional view showing a cross-section of a solid state imaging device 20 which corresponds to one pixel of an example of the solid state imaging device according to the present invention.

In the solid state imaging device 20, a sensor (light receiving portion) 2 is formed in a semiconductor substrate 1 and a transfer electrode 4 is formed through a gate insulating film 3 on the semiconductor substrate 1 except for the light receiving portion 2. On the transfer electrode 4 is formed is a light shielding film 6 through an inter-layer insulating film 5. The light shielding film 6 prevents a light from being incident on the transfer electrode 4. An opening is formed through the light shielding film 6 at its portion on the light receiving portion 2 so that a light is made incident on the light receiving portion 2 through the opening.

Figure 1:
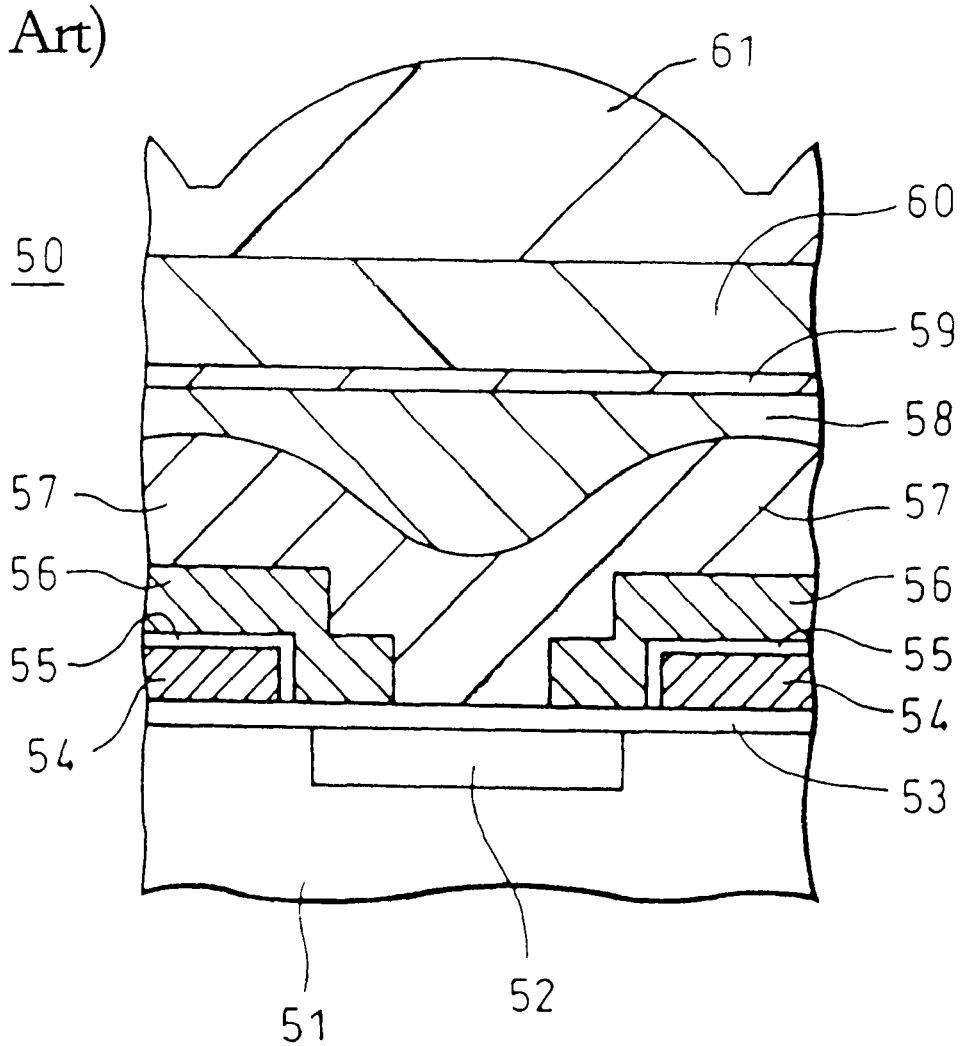
FIG. 1 is a schematic diagram (sectional view of one pixel) showing an example of a solid state imaging device in which an intra-layer lens is formed that does not have a well-shaped dug structure.

Similar to the example shown in FIG. 1, an inter-layer insulating film 7 made of, for example, BPSG(refractive index n=1.4~1.5) or the like and having on its surface a concave and a convex corresponding to a step by the light shielding film 6 is formed to cover the light shielding film 6.

In the example shown in FIG. 2, a well-shaped dug structure 21 is formed in the inter-layer insulating film 7 made of the BPSG or the like at its portion above the light receiving portion 2.

The peripheral portion of the well-shaped dug structure 21 becomes a concave lens structure (so-called intra-layer lens) similar to the example shown in FIG. 1. In other words, the well-shape dug structure 21 is formed in a bottom portion at the center of the intra-layer lens.

On the inter-layer insulating film 7 there is formed a high refractive index layer 8 made of, for example, a SiN film (refractive index n=1.9~2.0) or the like, and on the interface between the two layers 7 and 8 a light is refracted or totally reflected.

In this case, in order to converge a light on the light receiving portion 2, the refractive index of the high refractive index layer 8, which is an upper layer than the inter-layer insulating film 7, is adjusted to be larger than the refractive index of the inter-layer insulating film 7.

Thereafter, similar to the example mentioned before, the upper surface of the high refractive index layer 8 is flattened, and formed thereon is a color filter 10 through a passivation film 9. Further, a microlens 11 is formed on the color filter 10.

Figure 3:
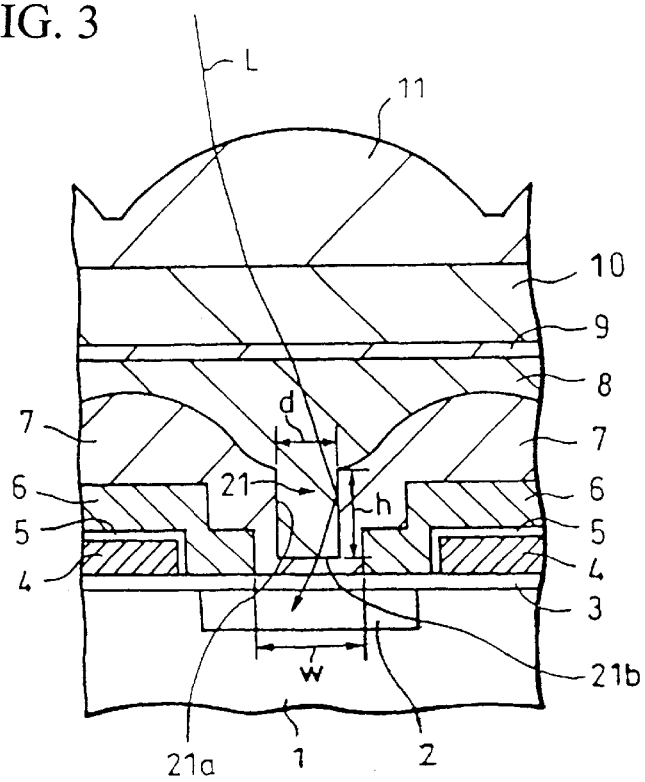
FIG. 3 is a sectional view used to explain a well structure shown in FIG.2.

In this example, as shown in FIG. 3, it is preferable that to a depth of h the well-shaped dug structure 21 is dug deep such that the thickness of the inter-layer insulating film 7 remaining underneath the well structure 21 is about several hundred nm.

Further, in order that the incident angle of light incident on the inside of the well structure 21 is made as large as possible relative to a side wall 21a of the well structure 21, as shown in FIG. 3, the aspect ratio of the well structure 21, that is, the ratio between the depth h of the well structure 21 and its width d in the substrate surface direction or h/d must be set as large as possible.

Therefore, it is preferred in this time that the width d of the well structure 21 in the substrate surface direction is set to be smaller that an opening width w of the light shielding film 6 above the light receiving portion 2.

When the well structure 21 with the high aspect ratio mentioned above is formed, the light incident on the inside of the well structure 21 becomes small in incident angle relative to the side wall 21a of the well structure 21 due to the high aspect ratio and is apt to be totally reflected.

When the incident light is totally reflected on the side wall 21a of the well structure 21 once, if the refractive indexes of two large 7 and 8 forming the well structure 21 and its aspect ratio h/d are taken into consideration, it may be considered that, as shown in FIG. 3, an incident light L totally reflected on the side wall 21a repeats the total reflection until it reaches a bottom portion 21b of the well structure 21. In other words, the well structure 21 can present a kind of waveguides.

If the well structure 21 is dug down near the light receiving portion 2, the light incident on the inside of the well structure 21 can be introduced to the light receiving portion 2 without being leaked to the outside of the well structure 21.

Due to the increase in total reflection components of light, the ratio of light which will pass through the inter-layer insulating film 7 and then be incident on the light shielding film 6 is decreased.

Accordingly, the lowering of sensitivity caused by the reflection of light incident on the light shielding film 6 can be suppressed.

Figure 4:
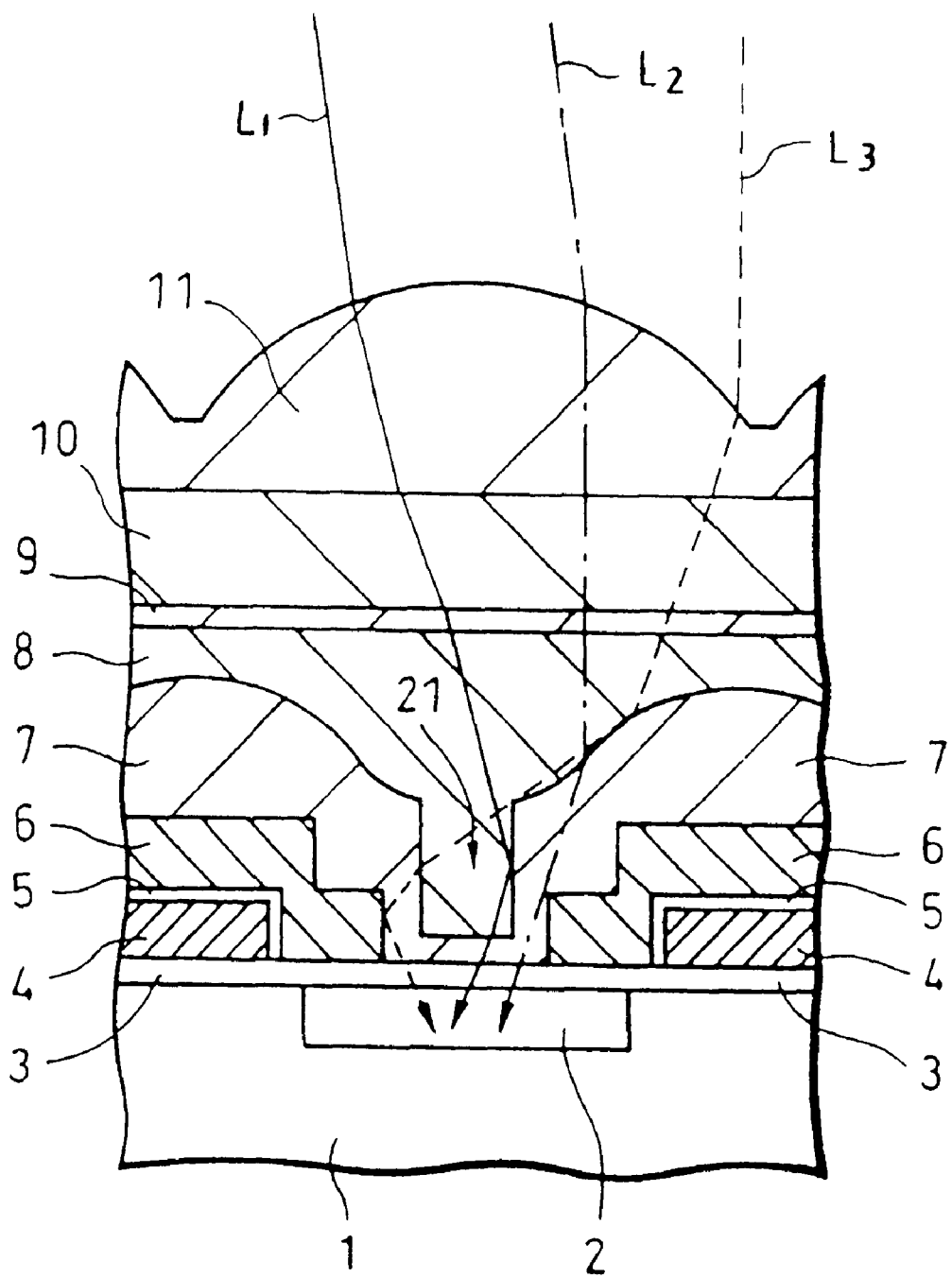
FIG. 4 is a sectional view showing a propagation path of an incident light in the solid state imaging device shown in FIG. 2.
Figure 5:
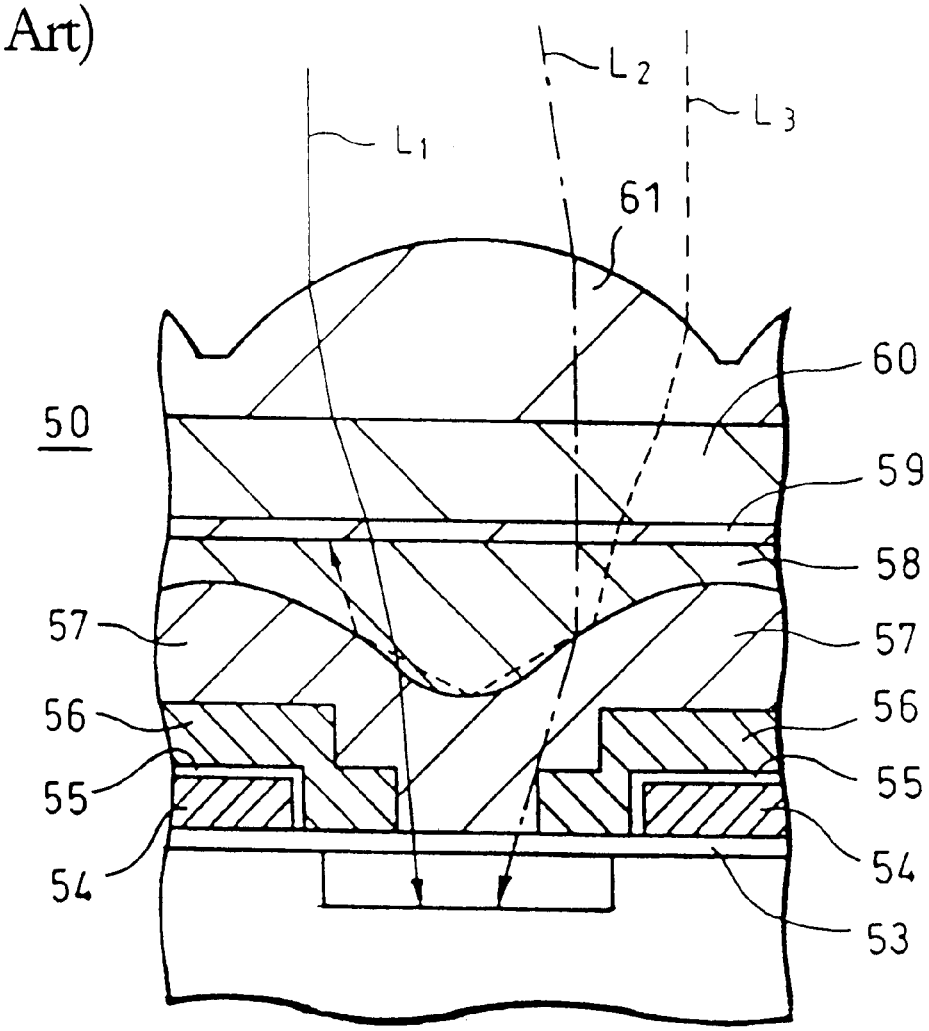
FIG. 5 is a sectional view showing a propagation path of an incident light in the solid state imaging device shown in FIG. 1.

In general, the intra-layer lens has such a function to introduce an incident light $L_2$ inherently incident on the light shielding film 56 to the light receiving portion 52 through a propagation path of incident light shown in FIG. 4 in the structure shown in FIG. 1.

As shown in FIG. 4, the well structure 21 of the example according to the present invention can introduce the incident light $L_2$ on the light shielding film 6 to the light receiving portion 2 and does not damage the above-mentioned the intra-layer lens effect.

Meanwhile, due to the total reflection on the concave surface in the intra-layer lens, there is a light $L_3$ which is not incident on the sensor 52 as shown in FIG. 4. On the other hand, in the example of the present invention, as shown in FIG. 4, since the entrance of the well structure 21 exists at that portion, such an incident light $L_3$ is not totally reflected but is introduced into the well structure 21. Therefore, as compared with the intra-layer lens structure, the amount of light incident on the light receiving portion 2 is increased, and hence the sensitivity of the solid state imaging device is improved.

In order to enhance the sensitivity further, if, for example, a reflection film made of Al, W and so on is formed on the side wall 21a of the well structure 21, a light component passing through the side wall 21a is removed and hence the sensitivity can be made high. Such the reflection film can be formed in such a manner that a reflection film is formed on, for example, the whole surface of the well structure as a thin film and then is subjected to an anisotropic etching to remain the thin film only the side wall of the well structure.

The above-mentioned well structure can be formed as follows.

First of all, the light receiving portion 2 and resection regions such as a charge transfer unit, a channel stop region or the like (not shown) are formed in the semiconductor substrate 1 by the well-known method, and also on the surface of the semiconductor substrate 1 the gate insulating film 3, thereon the transfer electrode 4, thereon the inter-layer insulating film 5, and thereon the light shielding film 6 are sequentially formed. Thereafter, the opening is formed through the light shielding film 6 at its portion corresponding to the light receiving portion 2.

Subsequently, the inter-layer insulating film 7 such as the BPSG film (refractive index n=1.4~1.5) or the like is deposited to cover the light shielding film 6 and the opening on the light receiving portion 2.

Thereafter, the inter-layer insulating film 7 is reflowed by, for example, a heat treatment to thereby form the intra-layer lens shape having the concave and the convex corresponding to the step by the light shielding film 6 on the surface and the concave portion above the light receiving portion 2.

In the solid state imaging device 50 shown in FIG. 1, immediately thereafter, in order to obtain the lens characteristics, for example, a silicon nitride film or the like having a refractive index larger than that of the inter-layer insulating film 57 is formed.

On the contrary, according to FIG. 2, in the solid state imaging device of the present invention, the inter-layer insulating film 7 is subjected to the patterning to form the vertically dug well structure 21 at the portion having the lowest height of the concave in the concave and the convex of the reflowed inter-layer insulating film 7 by the anisotropic etching.

Next, the light refractive index layer 8 is formed on the inter-layer insulating film 7 to bury the well structure 21.

Then, the surface of the high refractive index layer 8 is flattened and thereon formed is the color filter 10 through passivation film 9.

Further, a layer made of the material for the microlens 11 is formed on the color filter 10 and is subjected to the reflow to shape the same in the form of microlens 11.

In this way, the solid state imaging device 20 with the structure shown in FIG. 2 can be formed.

According to the solid state imaging device of the present invention, in the solid state imaging device provided with the concave lens structure above the sensor opening, since the dug-shaped well structure is provided at the bottom portion of the concave lens, the total reflection of light on the bottom portion of the concave lens is avoided and the light incident on the bottom portion of the concave lens can be introduced into the light receiving portion. Therefore, it is possible to increase the light receiving amount and hence to improve the sensitivity.

Further, according to the present invention, the refractive indexes of the respective layers are so adjusted to cause the total reflection of light on the side wall of the well structure, so that the light incident on the portion above the sensor is suppressed in being incident on the light shielding film to reduce the light kicked by the light shielding film to thereby improve the sensitivity.

Therefore, the present invention can produce a solid state imaging device with high sensitivity.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention.

What is claimed is:

1. A solid state imaging device, comprising:
   a sensor having a light receiving portion;
   a layer above said sensor in a direction towards which light enters said sensor, said layer having
      an uppermost surface in a direction away from said sensor,
      a concave lens structure on said uppermost surface provided above said light receiving portion of said sensor, said concave lens structure having a bottom portion at a center point on said uppermost surface and
      a well-shaped dug structure located at said bottom portion of said concave lens structure.

2. A solid state imaging device as claimed in claim 1, wherein a refractive index of a material burying said well-shaped dug structure and said concave lens structure to present a flat surface is larger than a refractive index of a material used in said concave lens structure.

3. A solid state imaging device as claimed in claim 1, wherein a width of said well-shaped dug structure in a substrate surface direction is made smaller than a sensor opening width, and a ratio between said width and a depth of said well-shaped dug structure is made sufficiently large to cause an incident light in said well-shaped dug structure to be totally reflected.

4. A solid state imaging device, comprising:
   a semiconductor substrate having a light receiving portion formed in said semiconductor substrate;
   a gate insulating film formed on top of said semiconductor substrate;
   a transfer electrode formed on top of said gate insulating film, said transfer electrode not covering said light receiving portion
   a light shielding film formed on top of said transfer electrode and on top of said light receiving portion, said light shielding film having an opening above said light receiving portion;
   an inter-layer insulating layer covering said light receiving portion, having an uppermost surface in a direction away from said semiconductor substrate; and
   a well-shaped dug structure in said uppermost surface of said inter-layer insulating layer located above said light receiving portion, but not extending over said opening in said light shielding film.

5. A solid state imaging device as claimed in claim 4, wherein said inter-layer insulating layer comprises a concave lens structure.

6. A solid state imaging device as claimed in claim 5, wherein a refractive index of a material burying said well-shaped dug structure and said concave lens structure to present a flat surface is larger than a refractive index of a material used in said concave lens structure.

7. A solid state imaging device as claimed in claim 5, wherein a width of said well-shaped dug structure in a substrate surface direction is made smaller than a sensor opening width, and a ratio between said width and a depth of said well-shaped dug structure is made sufficiently large to cause an incident light in said well-shaped dug structure to be totally reflected.

8. A solid state imaging device as claimed in claim 4, wherein said inter-layer insulating layer is made of BPSG.

9. A solid state imaging device as claimed in claim 4, wherein a material to bury said well-shaped dug structure and said concave lens structure and to flatten the same is a SiN film.

10. A solid state imaging device as claimed in claim 4, wherein a reflection film is formed on a side wall of said well-shaped dug structure.

11. A solid state imaging device as claimed in claim 10, wherein said reflection film is made of Al or W.

12. A method of manufacturing a solid state imaging device, comprising steps of:

forming a light receiving portion for photoelectric-converting an incident light into a signal charge and a charge transfer portion for transferring said signal charge from said light receiving portion in a semiconductor substrate;

forming a gate insulating film on a surface of said semiconductor substrate;

forming a transfer electrode on said gate insulating film and above said charge transfer portion;

forming a light shielding film to cover said transfer electrode;

then, forming an opening in said light shielding film at its portion corresponding to said light receiving portion;

depositing an inter-layer insulating film to cover said light shielding film and said opening of said light receiving portion;

then, forming a concave portion above said light receiving portion by treating said inter-layer insulating film;

after patterning said inter-layer insulating layer, forming a well structure by vertically digging a most recessed portion of said concave portion through an anisotropic etching; and burying said well structure by a high refractive index layer.

13. A method for manufacturing a solid state imaging device as claimed in 12, wherein said treatment of said inter-layer insulating layer is a reflow treatment.

14. A method of for manufacturing a solid state imaging device as claimed in claim 12, wherein said high refractive index layer is higher than said inter-layer insulating layer in refractive index.

15. A method for manufacturing a solid state imaging device according to claim 12, further comprising the step of flattening a surface of said high refractive index layer.

* * * * *